(12) United States Patent
Wang

(10) Patent No.: US 8,286,465 B2
(45) Date of Patent: Oct. 16, 2012

(54) SELF-FILLETING DIE ATTACH PASTE

(75) Inventor: Minghai Wang, Shanghai (CN)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 13/295,172

(22) Filed: Nov. 14, 2011

(65) Prior Publication Data

US 2012/0055259 A1   Mar. 8, 2012

Related U.S. Application Data

(60) Division of application No. 12/861,028, filed on Aug. 23, 2010, now abandoned, which is a continuation of application No. PCT/CN2008/000393, filed on Feb. 25, 2008.

(51) Int. Cl.
  *G01N 11/00* (2006.01)
  *C08L 63/00* (2006.01)
  *C09J 9/00* (2006.01)
  *C09J 163/00* (2006.01)

(52) U.S. Cl. ............... 73/54.02; 73/54.01; 73/54.39

(58) Field of Classification Search .............. None
See application file for complete search history.

(56) References Cited

U.S. PATENT DOCUMENTS

| 7,000,457 B2 * | 2/2006 | Brown et al. ............ 73/61.71 |
| 7,645,637 B2 | 1/2010 | Forray |
| 2002/0151106 A1 | 10/2002 | Noro et al. |
| 2003/0119226 A1 | 6/2003 | Appelt et al. |
| 2004/0194537 A1 * | 10/2004 | Brown et al. ............ 73/54.01 |
| 2011/0046268 A1 * | 2/2011 | Wang ...................... 523/458 |

FOREIGN PATENT DOCUMENTS

| WO | 9911727 A1 | 3/1999 |
| WO | 0112716 A2 | 2/2001 |
| WO | 2005007766 A1 | 1/2005 |
| WO | WO 2009105911 A1 * | 9/2009 |

* cited by examiner

*Primary Examiner* — Michael J Feely

(74) *Attorney, Agent, or Firm* — Jane E. Gennaro

(57) ABSTRACT

A composition that will automatically flow (auto-flow) and form a fillet (self-fillet) will have a yield stress within the range of 1.8 Pa to 10 Pa (20 dynes/cm$^2$ to 100 dynes/cm$^2$). Such a composition can be designed by using an appropriate choice of filler, regardless of the resin system used in the composition.

1 Claim, No Drawings

SELF-FILLETING DIE ATTACH PASTE

CROSS-REFERENCE TO RELATED APPLICATIONS

This application is a divisional of U.S. patent application Ser. No. 12/861,028, filed Aug. 23, 2010 (now abandoned), which is a continuation of International Patent Application Serial No. PCT/CN2008/000393 filed Feb. 25, 2008, the contents of both of which are incorporated herein by reference.

BACKGROUND OF THE INVENTION

Microelectronic devices contain millions of electrical circuit components supported by various types of substrates. The components include semiconductor silicon dies (chips). Electrical connections between these components and substrates are made between electrical terminals on the die and corresponding electrical terminals on the substrate. One method for making these connections uses a paste die attach adhesive to adhere the semiconductor die to the substrate and metal wires to bond the terminals on the die to terminals on the substrate.

In this die attach process, the die is contacted to the die attach adhesive with a sufficient degree of pressure and/or heat so that the adhesive spreads and completely covers the substrate under the die. It is desirable that the adhesive further forms a fillet, that is, a raised rim or ridge, at the periphery of the die.

Problems arise in the dispensing of die attach adhesives when thin dies are used and when dies are stacked. Conventional paste die attach materials are not suitable for these applications because the die attach material does not readily form a fillet at the desired boundary and can easily overflow into the crowded real estate of the semiconductor package and contaminate neighboring dies and electrical interconnects, or onto the top of the die, which will affect subsequent wirebonding process. In addition, the right levels of adhesive flow and bonding are difficult to achieve without the application of pressure. When pressure is applied to thin dies, the dies can crack, or tilt, or warp.

It would be preferable to apply a die attach material that has the right rheology to automatically flow and fill the area to be adhered without, or with minimal, application of pressure and/or heat, and to form a fillet accurately and uniformly at the perimeter of the area without the adhesive spreading onto peripheral areas.

SUMMARY OF THE INVENTION

The inventors have discovered that a composition that will automatically flow (auto-flow) and form a fillet (self-fillet) at 25° C. (ambient temperature) will have a yield stress within the range of 1.8 Pa to 10 Pa (20 dynes/cm2 to 100 dynes/cm2). Such a composition can be designed by using an appropriate choice of filler, regardless of the resin system used in the composition. Thus, this invention is a composition comprising a resin and a filler, characterized in that the composition has a yield stress within the range of 1.8 Pa to 10 Pa, thereby automatically flowing and forming a fillet at 25° C. Yield stress is the value at which the composition turns from a viscoelastic solid to a shear-thinning liquid and, for purposes of this specification and the claims, is measured by the protocol disclosed in the Detailed Description.

DETAILED DESCRIPTION OF THE INVENTION

Auto-flow means that the die attach adhesive, upon being disposed between two substrates and contacted with those substrates, will begin to flow at room temperature, without the application of more than slight pressure, and cover the area between the two substrates. Substrate can mean a substrate for a semiconductor die or the semiconductor die itself, such as would occur when two or more dies are arranged in a stacked geometry. Using the combination of semiconductor substrate and semiconductor die, self-fillet means that the die attach adhesive will stop its auto-flow at the periphery of the die on the substrate and solidify to form a fillet around the periphery of the die without overflowing onto the top of the die or spreading into an area on the substrate other than the immediate vicinity of the die. A fillet is a raised rim or ridge, and can have curved interior angles. In the case where two or more dies are arranged in a stacked geometry, a fillet may not be desired where the substrate is another die. By adjustment of the slight pressure and or the yield stress within the yield stress range, a fillet can be avoided for this geometry, although the paste is capable of self-filleting as described.

The yield stress value is determined from a rheological curve generated from a composition, comprising a resin and a filler, under stress at 25° C. The protocol is as follows using a Rheometer AR2000EX: the composition is initially sheared until it turns from a viscoelastic solid to a liquid; it is equilibrated; shear stress is applied from 0.1 Pa to 200 Pa; then the stress is reduced from 200 Pa to 0.1 Pa. The duration of each step is typically between two to ten minutes. The actual duration of each step is determined for each composition by running the protocol with a duration for each step at two minutes, and then running the protocol again at ten minutes. If the measurement of yield stress is the same at ten minutes as at two minutes, then two minutes is used as the duration for each step. If different, the yield stress at ten minutes is taken as the accurate yield stress value. At discretion, the practitioner can make several runs of the protocol at various durations for each step, until the results do not change, and pick the lowest duration of time for each step that gives consistent yield stress values. The ramp up curve recording the application of shear stress (from 0.1 Pa to 200 Pa) simulates the dispensing process for the die attach adhesive; the die attach adhesive is typically dispensed by syringe and the pressure of the syringe plunger exerts shear stress on the adhesive. The ramp down curve recording the reduction of the shear stress (from 200 Pa to 0.1 Pa) simulates the die attach process in which the die is contacted to the adhesive. The ramp down curve was found by the inventor to be more accurately predictive of the yield stress at which auto-flow and self-filleting will occur.

The forces driving auto-flow and self-filleting come mainly from the energy interactions between the adhesive paste and the die. When these driving forces are less than the yield stress of the adhesive, auto-flow and self-filleting will not occur. These driving forces are dependent on the semiconductor package design, which affects such parameters as die thickness, bond line thickness, adhesive paste density, surface energy of die and substrate, and interface energy of adhesive, die and substrate. In current package designs, typical driving force values are around 10 Pa; thus, when the yield stress of the die attach adhesive is less than 10 Pa, the adhesive paste will auto-flow. If the yield stress is too low to resist the energy interactions between the adhesive paste and die, over-flow will occur and although the adhesive will self-fillet, it will not self-fillet at the perimeter of the die. This typically occurs when the yield stress is less than around 1.8 Pa.

For filled resin systems, the yield stress will depend upon the nature of the interactions between the filler particles and the resin. Therefore, to design a composition to meet the above rheology with the appropriate yield stress, the key component is filler. Typically, smaller particle size fillers give higher yield stress values than larger particle size fillers at the same filler loading, and higher filler loadings give higher yield stress.

Auto-flow and self-filleting are achieved by the appropriate choice of the amount, size and shape of filler used in the composition effective to obtain a yield stress within the range of 1.8 Pa to 10 Pa. The shape of the filler can be particles or flakes or a combination of both. The filler can be any size ranging from nano size to several mm. The amount of filler is varied to provide the yield stress within the range effective to give auto-flow and self-filleting. With the disclosure in this specification, experimentation to determine the exact level of filler is within the expertise of one skilled in the art without undue experimentation.

Exemplary nonconductive fillers include silica (including fumed silica and other types of silica), silicon carbide, boron nitride, diamond, alumina, aluminum hydroxide, vermiculite, mica, wollastonite, calcium carbonate, titania, sand, glass, barium sulfate, zirconium, carbon black, organic fillers, and halogenated ethylene polymers, such as, tetrafluoroethylene, trifluoroethylene, vinylidene fluoride, vinyl fluoride, vinylidene chloride, vinyl chloride, and combinations of these.

In one embodiment, the filler is non-conductive, and in particular is a silica filler. Fumed silica shows much higher yield stress than spherical silica. In various embodiments, a combination of spherical silica and fumed silica is used and is an effective way to adjust the rheology to the desired yield stress range.

Exemplary electrically or thermally conductive fillers include carbon black and graphite; gold, silver, copper, platinum, palladium, nickel, aluminum, and alloys of these with each other or with other metals, other metal alloys, and metal-coated particles; glass, organic polymer, or silica spheres, or the like, coated with metal, and in particular, coated with gold, silver, copper, platinum, palladium, nickel, aluminum, and alloys of these with each other.

Suitable resins are thermoset or thermoplastic polymers. In various embodiments, these polymers are selected from the group consisting of epoxy, maleimide (including bismaleimide), acrylates and methacrylates, and cyanate esters, vinyl ethers, thiol-enes, resins that contain carbon to carbon double bonds attached to an aromatic ring and conjugated with the unsaturation in the aromatic ring (such as compounds derived from cinnamyl and styrenic starting compounds), fumarates and maleates. In various other embodiments, these polymers include polyamides, phenoxy compounds, benzoxazines, polybenzoxazines, polyether sulfones, polyimides, siliconized olefins, polyolefins, polyesters, polystyrenes, polycarbonates, polypropylenes, poly(vinyl chloride)s, polyisobutylenes, polyacrylonitriles, poly(vinyl acetate)s, poly(2-vinylpyridine)s, cis-1,4-polyisoprenes, 3,4-polychloroprenes, vinyl copolymers, poly(ethylene oxide)s, poly(ethylene glycol)s, polyformaldehydes, polyacetaldehydes, poly(b-propiolacetone)s, poly(10-decanoate)s, poly(ethylene terephthalate)s, polycaprolactams, poly(11-undecanoamide)s, poly(m-phenylene-terephthalamide)s, poly(tetramethylene-m-benzenesulfonamide)s, polyester polyarylates, poly(phenylene oxide)s, poly(phenylene sulfide)s, poly(sulfone)s, polyetherketones, polyetherimides, fluorinated polyimides, polyimide siloxanes, poly-isoindolo-quinazolinediones, polythioetherimide poly-phenyl-quinoxalines, polyquinixalones, imide-aryl ether phenylquinoxaline copolymers, polyquinoxalines, polybenzimidazoles, polybenzoxazoles, polynorbornenes, poly(arylene ethers), polysilanes, parylenes, benzocyclobutenes, hydroxyl-(benzoxazole) copolymers, and poly(silarylene siloxanes).

Suitable epoxy resins include bisphenol, naphthalene, and aliphatic type epoxies. Commercially available materials include bisphenol type epoxy resins (Epiclon 830LVP, 830CRP, 835LV, 850CRP) available from Dainippon Ink & Chemicals, Inc.; naphthalene type epoxy (Epiclon HP4032) available from Dainippon Ink & Chemicals, Inc.; aliphatic epoxy resins (Araldite CY179, 184, 192, 175, 179) available from Ciba Specialty Chemicals, (Epoxy 1234, 249, 206) available from Dow Corporation, and (EHPE-3150) available from Daicel Chemical Industries, Ltd. Other suitable epoxy resins include cycloaliphatic epoxy resins, bisphenol-A type epoxy resins, bisphenol-F type epoxy resins, epoxy novolac resins, biphenyl type epoxy resins, naphthalene type epoxy resins, and dicyclopentadienephenol type epoxy resins.

Suitable maleimide resins include those having the generic structure

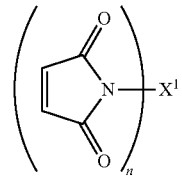

in which n is 1 to 3 and $X^1$ is an aliphatic or aromatic group. Exemplary $X^1$ entities include, poly(butadienes), poly(carbonates), poly(urethanes), poly(ethers), poly(esters), simple hydrocarbons, and simple hydrocarbons containing functionalities such as carbonyl, carboxyl, amide, carbamate, urea, ester, or ether. These types of resins are commercially available and can be obtained, for example, from Dainippon Ink and Chemical, Inc.

Additional suitable maleimide resins include, but are not limited to, solid aromatic bismaleimide (BMI) resins, particularly those having the structure

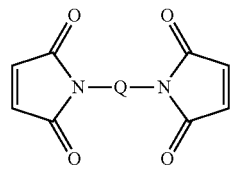

in which Q is an aromatic group. Bismaleimide resins having aromatic Q bridging groups are commercially available, and can be obtained, for example, from Sartomer (USA) or HOS-Technic GmbH (Austria).

Other suitable maleimide resins include

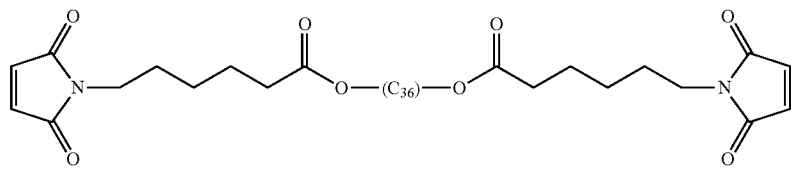

in which $C_{36}$ represents a linear or branched hydrocarbon chain (with or without cyclic moieties) of 36 carbon atoms;

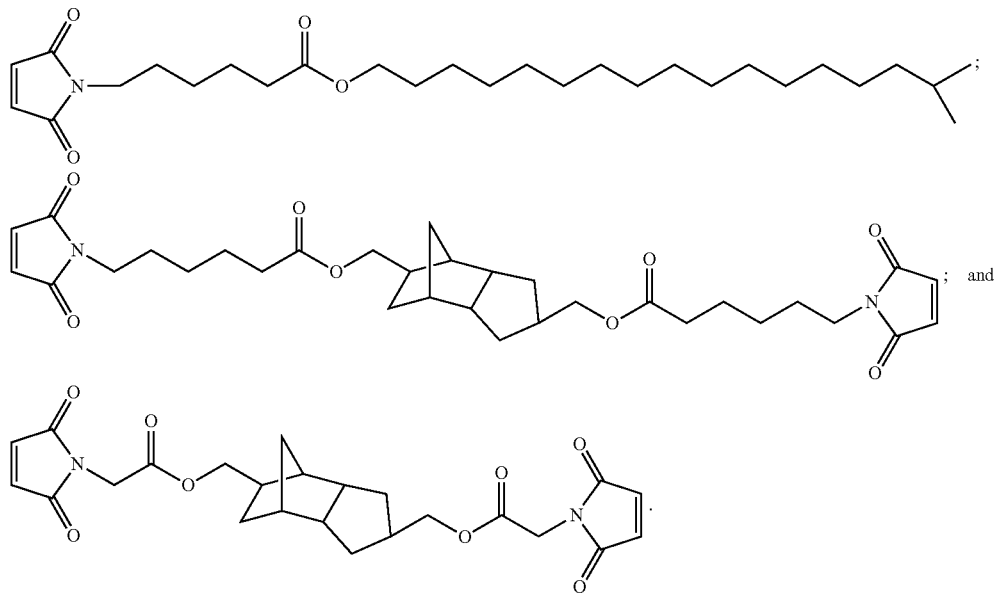

Suitable acrylate and methacrylate resins include those having the generic structure

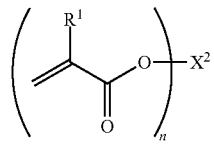

in which n is 1 to 6, $R^1$ is —H or —$CH_3$ and $X^2$ is an aromatic or aliphatic group. Exemplary $X^2$ entities include poly(butadienes), poly-(carbonates), poly(urethanes), poly(ethers), poly(esters), simple hydrocarbons, and simple hydrocarbons containing functionalities such as carbonyl, carboxyl, amide, carbamate, urea, ester, or ether. Commercially available materials include butyl(meth)acrylate, isobutyl(meth)acrylate, 2-ethyl hexyl(meth)acrylate, isodecyl(meth)acrylate, n-lauryl(meth)acrylate, alkyl(meth)-acrylate, tridecyl(meth)acrylate, n-stearyl(meth)acrylate, cyclohexyl(meth)-acrylate, tetrahydrofurfuryl(meth)acrylate, 2-phenoxy ethyl (meth)acrylate, isobornyl(meth)acrylate, 1,4-butanediol di(meth)acrylate, 1,6-hexanediol di(meth)acrylate, 1,9-nonandiol di(meth)acrylate, perfluorooctylethyl(meth)acrylate, 1,10 decandiol di(meth)acrylate, nonylphenol polypropoxylate(meth)acrylate, and polypentoxylate tetrahydrofurfuryl acrylate, available from Kyoeisha Chemical Co., LTD; polybutadiene urethane dimethacrylate (CN302, NTX6513) and polybutadiene dimethacrylate (CN301, NTX6039, PRO6270) available from Sartomer Company, Inc; polycarbonate urethane diacrylate (ArtResin UN9200A) available from Negami Chemical Industries Co., LTD; acrylated aliphatic urethane oligomers (Ebecryl 230, 264, 265, 270, 284, 4830, 4833, 4834, 4835, 4866, 4881, 4883, 8402, 8800-20R, 8803, 8804) available from Radcure Specialities, Inc; polyester acrylate oligomers (Ebecryl 657, 770, 810, 830, 1657, 1810, 1830) available from Radcure Specialities, Inc.; and epoxy acrylate resins (CN104, 111, 112, 115, 116, 117, 118, 119, 120, 124, 136) available from Sartomer Company, Inc. In one embodiment the acrylate resins are selected from the group consisting of isobornyl acrylate, isobornyl methacrylate, lauryl acrylate, lauryl methacrylate, poly(butadiene) with acrylate functionality and poly(butadiene) with methacrylate functionality.

Commercially available cyanate ester materials include; AroCy L-10, AroCy XU366, AroCy XU371, AroCy XU378, XU71787.02L, and XU 71787.07L, available from Huntsman LLC; Primaset PT30, Primaset PT30 S75, Primaset PT60, Primaset PT60S, Primaset BADCY, Primaset DA230S, Primaset MethylCy, and Primaset LECY, available from Lonza Group Limited; 2-allyphenol cyanate ester, 4-methoxyphenol cyanate ester, 2,2-bis(4-cyanatophenol)-1,1,1,3,3,3-hexafluoropropane, bisphenol A cyanate ester, diallylbisphenol A cyanate ester, 4-phenylphenol cyanate ester, 1,1,1-tris(4-cyanatophenyl)ethane, 4-cumylphenol cyanate ester, 1,1-bis(4-cyanato-phenyl)ethane, 2,2,3,4,4,5,5,6,6,7,7-dodecafluoro-octanediol dicyanate ester, and 4,4'-bisphenol cyanate ester, available from Oakwood Products, Inc.

Suitable vinyl ether resins are any containing vinyl ether functionality and include poly(butadienes), poly(carbonates), poly(urethanes), poly(ethers), poly(esters), simple hydrocarbons, and simple hydrocarbons containing functionalities such as carbonyl, carboxyl, amide, carbamate, urea, ester, or ether. Commercially available resins include cyclohexanedimethanol divinylether, dodecylvinylether, cyclohexyl vinylether, 2-ethylhexyl vinylether, dipropyleneglycol divinylether, hexanediol divinylether, octadecylvinylether, and butandiol divinylether available from International Speciality Products (ISP); Vectomer 4010, 4020, 4030, 4040, 4051, 4210, 4220, 4230, 4060, 5015 available from Sigma-Aldrich, Inc.

The curing agent for the thermoset or thermoplastic polymer reactant can be either a free radical initiator or ionic initiator (either cationic or anionic), depending on whether a radical or ionic curing resin is chosen. The curing agent will be present in an effective amount. For free radical curing agents, an effective amount typically is 0.1 to 10 percent by weight of the organic compounds (excluding any filler), but can be as high as 30 percent by weight. For ionic curing agents or initiators, an effective amount typically is 0.1 to 10 percent by weight of the organic compounds (excluding any filler), but can be as high as 30 percent by weight. Examples of curing agents include imidazoles, tertiary amines, organic metal salts, amine salts and modified imidazole compounds, inorganic metal salts, phenols, acid anhydrides, and other such compounds.

In some cases, it may be desirable to use more than one type of cure, for example, both cationic and free radical initiation, in which case both free radical cure and ionic cure resins can be used in the composition. Such a composition would permit, for example, the curing process to be started by cationic initiation using UV irradiation, and in a later processing step, to be completed by free radical initiation upon the application of heat.

In some systems in addition to curing agents, curing accelerators may be used to optimize the cure rate. Cure accelerators include, but are not limited to, metal napthenates, metal acetylacetonates (chelates), metal octoates, metal acetates, metal halides, metal imidazole complexes, metal amine complexes, triphenylphosphine, alkyl-substituted imidazoles, imidazolium salts, and onium borates.

EXAMPLES

In each of the examples, formulations were prepared to contain a resin and a hardener (RH) in which the hardener is a curing agent. These were then loaded with fillers at various loading levels. Each formulation was tested for viscosity on a Brookfield viscometer using a CP51 spindle at five revolutions per minute (5 rpm) and for yield stress using a Rheometer AR 2000ex from TA company. Thixotropic Index was determined by measuring the ratio viscosity at 0.5 rpm/viscosity at 5 rpm. Yield stress was measured using the protocol described above in the Detailed Description. Each formulation also was tested for auto-flow and self-filleting using 10 mm×10 mm, 0.175 mm thick, glass die, on a glass slide as the test vehicle. The die attach was done manually. For current industrial purposes, a fillet of greater than 0.15 mm in length is considered to be overflowed. In some of the samples, fillets formed below a yield stress of 1.8 Pa, but these were greater than 0.15 mm in length.

Example 1

Acrylate Resin and Filler Loading Effect

In this Example, the effect of the level of filler loading and type of filler was tested on a composition comprising an acrylate resin, hardener, and silica filler. The identities of the materials and amounts used, and the results of the testing, are disclosed in the Tables.

TABLE 1-A

| Acrylate RH Formulation in Weight % | | |
|---|---|---|
| Resin and Hardener | Urethane acrylate (UN9200A, Negami Chemical Ind.) | 55 wt % |
| | Isobornyl methacrylate (SR423A, Sartomer) | 45 wt % |
| | Peroxide (LUPEROX 531M80, Arkema Inc.) | 1 wt % |
| Viscosity | at 5 RPM in mPa · s | 11600 |

TABLE 1-B

| | RH wt % | silica SE-15 wt % | silica SE1050 wt % | silica TS720 wt % | viscos (mPa · s) | thix index | yield stress (Pa) | auto flow | self fillet |
|---|---|---|---|---|---|---|---|---|---|
| A | 60 | 40 | | | 29600 | 1.1 | 0.25 | yes | yes but >0.15 mm |
| B | 60 | | 40 | | 68600 | 2 | 72 | no | no |
| C | 60 | 20 | 20 | | 38700 | 1.3 | 4.2 | yes 60 min | yes |
| D | 60 | 13.3 | 26.7 | | 45200 | 1.5 | 11 | no | no |
| E | 60 | 26.7 | 13.3 | | 21100 | 1.3 | 1.0 | yes 45 min | yes but >0.15 mm |
| F | 60 | 38 | | 2 | 47300 | 1.8 | 12 | no | no |
| G | 70 | | 30 | | 35900 | 1.6 | 12 | no | no |
| H | 80 | | | | 22600 | 1.4 | 1.8 | yes 45 min | yes |

Note:
Silica SE-15 (National Starch&Chemical, Particle Size <20 μm)
Silica SE-1050 (Admatechs CO, Particle Size <2 μm)
Fumed Silica TS720 (Cabot)

Example 2

Bismaleimide Resin and Filler Type and Ratio Effect

In this Example, the effect of the level of filler loading and type of filler was tested on a composition comprising a bismaleimide resin, hardener, and silica filler. The materials and amounts used, and the results of the testing, are disclosed in the Tables.

TABLE 2-A

| Bismaleimide RH Formulation in Weight % | | |
|---|---|---|
| Resin and Hardener | Bismaleimide 1 | 100 wt % |
| | Peroxide (LUPEROX 531M80, Arkema Inc.) | 1 wt % |
| Viscosity | at 5 RPM in mPa · s | 1700 |

Bismaleimide 1 has the structure:

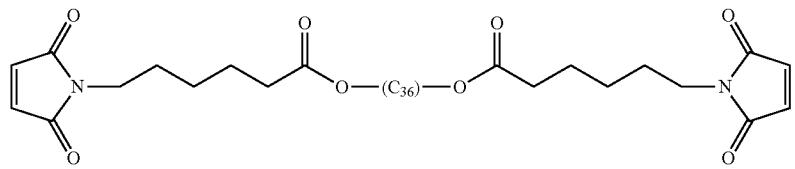

in which C36 represents a linear or branched hydrocarbon chain (with or without cyclic moieties) of 36 carbon atoms.

TABLE 2-B

Bismaleimide RH Formulation in Weight % and Performance

| | RH wt % | silica SE-15 wt % | silica SE-1050 wt % | silica TS720 | viscos (mPa·s) | thix index | yield stress (Pa) | auto flow | self fillet |
|---|---|---|---|---|---|---|---|---|---|
| A | 60 | 40 | | | 4200 | 1 | 0.04 | yes 20 min | yes but >0.15 mm |
| B | 60 | | 40 | | 12000 | 2.8 | 23 | no | no |
| C | 60 | 20 | 20 | | 6400 | 2 | 3.9 | yes 30 min | yes |
| D | 60 | 13.3 | 26.7 | | 7600 | 2.2 | 7.3 | yes 60 min | yes |
| E | 60 | 26.7 | 13.3 | | 5400 | 1.6 | 1.6 | yes 30 min | yes but >0.15 mm |
| F | 60 | 38 | | 2 | 8100 | 2.2 | 5.8 | yes 60 min | yes |
| G | 70 | 30 | | | 6100 | 2.3 | 6.5 | yes 60 min | yes |
| H | 80 | 20 | | | 3700 | 1.7 | 1.4 | yes 30 min | yes but >0.15 mm |

Note:
Silica SE-15 (National Starch&Chemical, Particle Size <20 μm)
Silica SE-1050 (Admatechs CO, Particle Size <2 μm)
Fumed Silica TS720 (Cabot)

Example 3

Epoxy Resin and Filler Loading Effect

In this Example, the effect of the level of filler loading and type of filler was tested on a composition comprising an epoxy resin, hardener, and silica filler. The identities of the materials and amounts used, and the results of the testing, are disclosed in the Tables.

TABLE 3-A

Epoxy RH Formulation in Weight %

| | | |
|---|---|---|
| Resin and Hardener | Bis-F epoxy (Epiclon 830s, Dainippon Ink and Chemicals) | 50 wt % |
| | Methylhexahydrophthalic anhydride (MHHPA) (Lonza) | 40 wt % |
| | 1-(2-cyanoethyl)-2-ethyl-4-methylimidazole (Curimid CN, Borregaard Synthesis) | 0.1 wt % |
| Viscosity | at 5 RPM in mPa·s | 414 |

TABLE 3-C

Epoxy RH Formulation in Weight % and Performance

| | RH in wt % | silica SE-15 wt % | Silica SE-1050 wt % | silica TS720 wt % | viscos (mPa·s) | thix index | yield stress (Pa) | auto flow | self fillet |
|---|---|---|---|---|---|---|---|---|---|
| A | 60 | 40 | | | 1700 | 1 | 0.02 | yes 15 min | yes but >0.15 mm |
| B | 60 | | 40 | | 11000 | 2.8 | 14 | no at RT yes at 60 C. | no at RT yes at 60 C. |
| C | 60 | 20 | 20 | | 3100 | 2.1 | 2.1 | yes 30 min | yes |
| D | 60 | 13.3 | 26.7 | | 4500 | 2.3 | 4.1 | yes 30 min | yes |
| E | 60 | 26.7 | 13.3 | | 2300 | 1.7 | 0.83 | yes 30 min | yes but >0.15 mm |
| F | 60 | 38 | | 2 | 12000 | 5 | 63 | no | no |

TABLE 3-C-continued

Epoxy RH Formulation in Weight % and Performance

| | RH in wt % | silica SE-15 wt % | Silica SE-1050 wt % | silica TS720 wt % | viscos (mPa·s) | thix index | yield stress (Pa) | auto flow | self fillet |
|---|---|---|---|---|---|---|---|---|---|
| G | 70 | | 30 | | 3000 | 2.4 | 2.7 | yes 30 min | yes |
| H | 80 | | 20 | | 1300 | 1.7 | 0.35 | yes 30 min | yes but >0.15 mm |

Note:
Silica SE-15 (National Starch&Chemical, Particle Size <20 μm)
Silica SE-1050 (Admatechs CO, Particle Size <2 μm)
Fumed Silica TS720 (Cabot)

Example 4

Silver Filler

In this Example, silver was used as filler with the same yield stress effect as with silica.

TABLE 4

Formulation - Silver Flake Filler

| Formulation | BMI RH from Table 2-A | 25% | 25% | 25% | 30% |
|---|---|---|---|---|---|
| | Silver flake (GA 23811, Metalor) | 75% | | | 70% |
| | Silver flake (EA0297, Metalor) | | 75% | | |
| | Silver flake (SF 87 Ferro) | | | 75% | |
| Rheology Test | Viscosity at 5 RPM in mPa·s | 7700 | 9000 | 8600 | 5600 |
| | Thixotropic Index | 2.4 | 3.1 | 2.4 | 2.1 |
| | Yield Stress | 8 Pa | 17 Pa | 9 Pa | 4 Pa |
| Performance | Auto-flow & Self-filleting | Yes | No | Yes | Yes |

Example 5

Self-filleting Material Evaluation on Die Bonder

Typical dies in current use include, but are not limited to, glass, silicon with or without passivation layers (e.g. boron nitride, polyimide); typical substrates in current use include, but are not limited to, glass die, silicon die, BGA, A42, Cu, Ag, and PPF. These materials are known to those practicing in the art. In this Example, samples from Examples 1, 2, and 3 were evaluated on a commercial die bonder, Swissline 9022 (from AlphaSEM), using a 10×10 mm silicon die at 0.1 mm thickness, with PBGA as the substrate, and a modified snow-star dispense pattern. The results are set out in the following table and are consistent with the results obtained from the manual die attach using a glass die and a glass slide substrate.

TABLE 5

Evaluation on Die Bonder Equipment

| | Rheology Property | | | Die Bonder Condition | | Self-filleting Performance | | |
|---|---|---|---|---|---|---|---|---|
| Sample | Viscos (mPa·s) | TI | Yield Stress (Pa) | Bond Force (g) | Bond Time (ms) | Self-filleting? Yes/No | Bond line (μm) | Fillet (μm) |
| Ex. 1-C Acrylate | 38700 | 1.3 | 4.2 | 180 | 1000 | Yes | 30 | 30 |
| Ex. 1-G Acrylate | 35900 | 1.6 | 12 | 180 | 1000 | No | | |
| Ex. 2-C BMI | 6400 | 2 | 3.9 | 100 | 150 | Yes | 31 | 40 |
| Ex. 2-G BMI | 6100 | 2.3 | 6.5 | 100 | 150 | Yes | 28 | 70 |
| Ex. 3-C Epoxy | 3100 | 2.1 | 2.1 | 100 | 150 | Yes | 30 | 140 |
| Ex. 3-G Epoxy | 3000 | 2.4 | 2.7 | 100 | 150 | Yes | 30 | 120 |

I claim:
1. A method for selecting die attach adhesives that will auto-flow and self-fillet when disposed between two substrates comprising:
   providing a die attach adhesive comprising a resin and a filler;
   applying an initial shear stress to the die attach adhesive until it turns from a viscoelastic solid to a liquid, for a time duration ranging from two to ten minutes at 25° C.;
   equilibrating the die attach adhesive, for a time duration ranging from two to ten minutes at 25° C.;
   applying shear stress to the die attach adhesive by ramping up from 0.1 Pa to 200 Pa, for a time duration ranging from two to ten minutes at 25° C. and then by ramping down from 200 Pa to 0.1 Pa, for a time duration ranging from two to ten minutes at 25° C., to generate a yield stress rheological curve;
   determining the yield stress value from the yield stress rheological curve; and
   selecting those die attach adhesives that have a yield stress value between 1.8 Pa and 10 Pa.

* * * * *